(12) United States Patent
Lindström et al.

(10) Patent No.: US 11,832,460 B2
(45) Date of Patent: Nov. 28, 2023

(54) WORKING ELECTRODE FOR A PHOTOVOLTAIC DEVICE, AND A PHOTOVOLTAIC DEVICE INCLUDING THE WORKING ELECTRODE

(71) Applicant: Exeger Operations AB, Stockholm (SE)

(72) Inventors: Henrik Lindström, Danderyd (SE); Giovanni Fili, Danderyd (SE)

(73) Assignee: EXEGER OPERATIONS AB, Stockholm (SE)

( * ) Notice: Subject to any disclaimer, the term of this patent is extended or adjusted under 35 U.S.C. 154(b) by 0 days.

(21) Appl. No.: 17/776,207

(22) PCT Filed: Nov. 25, 2020

(86) PCT No.: PCT/EP2020/083300
§ 371 (c)(1),
(2) Date: May 11, 2022

(87) PCT Pub. No.: WO2021/105172
PCT Pub. Date: Jun. 3, 2021

(65) Prior Publication Data
US 2022/0393125 A1 Dec. 8, 2022

(30) Foreign Application Priority Data
Nov. 26, 2019 (EP) .................................... 19211584

(51) Int. Cl.
*H10K 30/83* (2023.01)
*H10K 30/65* (2023.01)
*H10K 30/15* (2023.01)

(52) U.S. Cl.
CPC ........... *H10K 30/83* (2023.02); *H10K 30/151* (2023.02); *H10K 30/65* (2023.02)

(58) Field of Classification Search
CPC .... H01G 9/2031; H01G 9/204; H01G 9/2059; H10K 30/151; H10K 30/152; H10K 30/65; H10K 30/83
See application file for complete search history.

(56) References Cited

U.S. PATENT DOCUMENTS

| 6,359,211 B1 | 3/2002 | Spitler |
| 2008/0210296 A1 | 9/2008 | Morooka |

(Continued)

FOREIGN PATENT DOCUMENTS

| CN | 108962612 A | 12/2018 |
| EP | 2533352 A1 | 12/2012 |

(Continued)

OTHER PUBLICATIONS

Zhang, "Dye aggregation in dye-sensitized solar cells". J. Mater. Chem. A, 2017, 5,19541-19559 (Year: 2017).*
International Search Report and Written Opinion from corresponding International Application No. PCT/EP2020/083300, dated Jan. 13, 2021, 17 pages.

(Continued)

*Primary Examiner* — Devina Pillay
(74) *Attorney, Agent, or Firm* — Tucker Ellis LLP (57) ABSTRACT

The present invention relates to a working electrode (1a) for a photovoltaic device, comprising a light absorbing layer (3) and a conductive layer (6) arranged in electrical contact with the light absorbing layer (3), and the light absorbing layer (3) comprises a light absorbing photovoltaic material consisting of a plurality of dye molecules. The light absorbing layer (3) is formed by a layer of a plurality of clusters (7), whereby each cluster (7) is formed by dye molecules and each dye molecule in the cluster (7) is bonded to its adjacent dye molecules.

17 Claims, 3 Drawing Sheets

(56) References Cited

U.S. PATENT DOCUMENTS

| | | | | |
|---|---|---|---|---|
| 2009/0072751 | A1* | 3/2009 | Tischler | H10K 50/852 |
| | | | | 445/51 |
| 2013/0160838 | A1* | 6/2013 | Ting | B82Y 30/00 |
| | | | | 977/948 |

FOREIGN PATENT DOCUMENTS

| | | | |
|---|---|---|---|
| EP | 2834823 | A1 | 2/2015 |
| JP | 2005019253 | A | 1/2005 |
| JP | 2006156212 | A | 6/2006 |
| JP | 2015119023 | A | 6/2015 |
| JP | 2016207919 | A | 12/2016 |
| KR | 101469570 | B1 | 12/2014 |
| WO | 2013053501 | A1 | 4/2013 |
| WO | 2013149787 | A1 | 10/2013 |
| WO | 2018021952 | A1 | 2/2018 |

OTHER PUBLICATIONS

Lei Zhang, et al., "Dye Aggregation in Dye-Sensitized Solar Cells," Journal of Materials Chemistry, Sep. 5, 2017, 19 pages.

Kianchang Gong, et al., "Preparation and Characterization of Porphyrin Nanoparticles," Journal of the American Chemical Society, vol. 124, No. 18, Dec. 4, 2022, 4 pages.

Hao Chen, et a.l, "Imaging Dye Aggregation in MK-2, N3, N749, and SQ-2 dye Tio2 Interfaces that Represent Dye-Sensitized Solar Cell Working Electrodes," ACS Applied Energy Materials, vol. 3. No. 4, Mar. 27, 2020, 13 pages.

International Preliminary Report on Patentability from corresponding International Application PCT/EP2020/083300, dated Mar. 3, 2022, 18 pages.

Japanese Office Action from corresponding Japanese Application No. 2022530301, dated Jul. 18, 2023, 12 pages with translation.

* cited by examiner

WORKING ELECTRODE FOR A PHOTOVOLTAIC DEVICE, AND A PHOTOVOLTAIC DEVICE INCLUDING THE WORKING ELECTRODE

TECHNICAL FIELD

The present invention relates to a working electrode comprising a light absorbing layer for use in a photovoltaic device. The present invention also relates a photovoltaic device including the working electrode.

BACKGROUND

Photovoltaic devices provide conversion of light into electricity using semiconducting materials that exhibit a photovoltaic effect.

A photovoltaic device, such as a solar cell, is a device which directly converts sunlight into electricity. Light incident on the surface of the photovoltaic device produces electric power. A photovoltaic device comprises a working electrode including a light absorbing layer. The light absorbing layer comprises a light absorbing photovoltaic material, which has the ability to absorb light, and to generate photo-excited electrons. When the energy of a photon is equal to or greater than the bandgap of the light absorbing material, the photon is absorbed by the material and a photo-excited electron is generated.

The energy of photons depends on the type of light source. For example, the energy of photons of indoor light is less than the energy of photons of sun light. Further, the energy of photons from the outdoor sun light depends on the latitude. If the energy of the photons reaching the light absorbing material is less than the bandgap of the light absorbing material, the photons cannot be absorbed by the material and thus the energy cannot be converted into electricity. If the energy of the photons reaching the light absorbing material is equal to or larger than the bandgap of the light absorbing material, the photons are absorbed by the material, but only the amount of energy corresponding to the bandgap is converted into electricity. Thus, it is important that the light absorbing material in the photovoltaic device has a bandgap that matches the light source that the device will be using.

Accordingly, it is a desire to be able to tune the bandgap of the light absorbing photovoltaic material to allow efficient light energy to electric energy conversion of a light spectrum from weak light sources, such as indoor light as well as from outdoor sun light.

Today, silicon is the most commonly used light absorbing photovoltaic material in solar cells. Silicon has several advantages, for example, it is chemically stable and environmentally friendly. Silicon provides efficient light energy to electric energy conversion of sun light. However, silicon is less efficient for conversion of weak light sources.

It is also known to use dye molecules as the light absorbing photovoltaic material in solar cells. Such solar cells are called dye-sensitized solar cells (DSSC). In DSSC solar cells, the light absorbing layer comprises a semiconducting scaffolding layer comprising a net of sintered particles, such as metal oxide particles, for example $TiO_2$ particles, dyed with a light adsorbing dye. Light absorbing dyes are also called sensitizing dyes. The dye molecules are disposed on the surface of the semiconducting particles. The dye absorbs the incident light and uses the energy in the light to excite electrons. The semiconducting particles serve as a material for transportation of the excited electrons to a conductive layer.

A dye-sensitized solar cell is described in EP2533352. In EP2533352 a porous semi-conductor layer is placed on a porous conductive metal layer that serves as current collector electrode. The porous semi-conductor layer absorbs a dye. The dye molecules will attach to the surface of the porous semi-conductor layer. The porous semi-conductor layer has a double function and acts as a scaffolding structure for holding the dye molecules spread out in a 3 dimensional structure. The other function is for the semi-conducting layer to transfer excited electrons (or holes) to the current collector. In EP2533352 is further described that due to the metallic properties of the current collector high conversion efficiency can be obtained even if the thickness of the porous semi-conductive layer is made thicker than 14 μm (a thicker semi-conducting layer can absorb more dye). A few common dyes such as ruthenium dye, phthalocyanine dye or cyanine dye are referred to in EP2533352.

Another configuration of a dye-sensitized solar cell is described in EP2834823, where a dye-sensitized solar cell including a working electrode, a porous insulating layer, a porous first conducting metal layer formed on top of the porous insulating layer and arranged in electrical and physical contact with the light absorbing layer, a counter electrode including a second conducting metal layer, and a conducting medium in the form of a liquid electrolyte for transferring charges between the counter electrode and the working electrode. The working electrode comprises a porous $TiO_2$ layer deposited onto the first conductive layer. Dye molecules are absorbed onto the surface of the $TiO_2$ particles of the $TiO_2$ layer in a conventional manner.

The dye molecules preferably form a monolayer of dye molecules on the particles of the scaffolding semi-conducting structure. To ensure sufficient light absorption, there should be a certain amount of sensitizing dye in the light absorbing layer. The number of molecules per $cm^2$ needed to achieve sufficient light absorption depends on the absorption coefficient of the dye. To achieve enough sensitizing dye in the light absorbing layer, the light absorbing layer normally includes several hundreds of layers of dyed semiconducting particles. The number of layers will determine the thickness of the light absorbing layer and increasing the amount of sensitizing dye will increase the thickness of the light absorbing layer. Thus, a problem with dye-sensitized solar cells is that in order to increase the amount of dye the porous semiconductor layer becomes thicker. A thick semi-conducting layer will reduce the efficiency of the solar cell due to longer electron diffusion lengths.

A number of documents, for example KR101469570, JP2016207919, describe various methods for preventing agglomeration of dye molecules in the semi-conducting layer of a dye-sensitized solar cell. Aggregations on the semi-conductor surfaces are described to be hindering the efficiency of the DSSCs.

Lei Zhang et al, "Dye aggregation in dye-sensitized solar cells", Journal of materials chemistry A, vol. 5, no. 37, 5 Sep. 2017, discloses a review regarding aggregation of dyes coated on $TiO_2$ in solar cells. On page 19542, $2^{nd}$ §, it especially mentions that dye aggregates severely disrupt the function of the DSSC device and that dye aggregation can affect the photovoltaic DSSC performance. Dye aggregation in DSSCs is most comely regarded as a phenomenon that is best to be avoided.

Another type of solar cell is described in WO2018/021952. A plurality of grains of a doped semi-conducting material in electrical contact with a conducting layer and the grains being at least partly surrounded by a charge conducting material, like PEDOT, is described. The grains are described to be made of silicon or alternatively of CdTe, CIGS, CIS, GaAs, or a perovskite.

In recent years, there has been an increasing interest in organic sensitizing dyes for usage in dye-sensitized solar cells (DSSCs) since it has been found that organic dyes in combination with ion-based electrolytes improve the performance of DSSC devices, in particular for indoor applications. There exist a large number of different types of sensitizing dyes with different abilities to absorb light.

SUMMARY

It is an aim of the present invention to at least partly overcome some of the above-mentioned problems and to provide an improved working electrode for a photovoltaic device, and an improved photovoltaic device including the working electrode.

This aim is achieved with a working electrode as defined in claim 1.

The working electrode for a photovoltaic device comprises a light absorbing layer and a conductive layer arranged in electrical contact with the light absorbing layer and the light absorbing layer comprises a light absorbing photovoltaic material consisting of a plurality of dye molecules. The light absorbing layer if formed by a layer of a plurality of clusters, whereby each cluster is formed by dye molecules and each dye molecule in a cluster is bonded to its adjacent dye molecules.

The dye molecules form a plurality of clusters of dye molecules. The clusters form a light-absorbing layer, which layer is in electrical contact with the conductive layer. The separate layer of clusters is not dispersed onto a scaffolding layer of a semi-conducting material.

By arranging the dye molecules into clusters that form a separate light-absorbing layer, the semi-conducting scaffolding layer of the conventional dye-sensitized solar cell can be omitted. Thus, the solar cell comprising a light-absorbing layer of clusters can be made thinner than the conventional dye-sensitized solar cell for the same amount of dye molecules.

The light absorbing layer does not contain dye molecules disposed or absorbed on surfaces of semiconducting particles. The dye molecules forming clusters are not disposed on semiconducting particles within a semiconducting layer. The clusters can be directly stacked, without support of a semiconducting scaffolding layer, on the surface of a conducting layer, thus forming a working electrode of a solar cell that can be directly connected to an external circuit.

In omitting the step where a dye is absorbed by a semi-conducting layer in preparation of a dye-sensitized solar cell, the production time of a solar cell is significantly reduced. Absorption of the dye can readily take several hours to complete. A further reduction of the production time is achieved by not having to form the semi-conducting scaffolding layer in producing the dye-sensitized solar cell.

Another advantage of having a light absorbing layer as a separate layer of clusters of dye molecules is that more dye molecules per square meter can be inserted compare to a dye-sensitized solar cell having the dye molecules absorbed by a semi-conducting layer.

The solar cell comprising a working electrode having a light absorbing layer made of clusters of dye molecules, where the clusters form a separate layer, can be made thinner than a dye-sensitized solar cell comprising a dye infused semi-conducting scaffolding layer. A thinner solar cell has many advantages. A shorter distance between the electrodes of the solar cell increase the efficiency of the solar cell. A thinner solar cell may also find new applications where it is desirable to have a thin and light-weight solar cell.

A cluster of dye molecules is formed by arranging the dye molecules in a crystal lattice or in a random, amorphous structure, or a combination thereof. By the term "crystal lattice" is meant that the cluster has a defined and repeatable arrangement of the dye molecules.

A dye molecule within the cluster is bonded to its adjacent dye molecules. The bond between the dye molecules can be electrostatic bonds, or covalent bonds, or van der Waal bonds, and the like.

The term "dye" shall be understood to refer to dyes that exhibit a photovoltaic effect, i.e. have the ability to absorb light, and to generate photo-excited electrons.

The dye molecules of the cluster can be dye molecules of different chemical composition. The amount of dye per volume needed in the light absorbing layer depends on the type of dye since different dyes have different absorptions coefficients, and accordingly their ability to absorb light is different. The size of the clusters can be controlled during the manufacturing of the clusters. Thus, it is possible to produce clusters of different sizes depending on the amount of dye needed in the light absorbing layer in order to absorb the incoming light efficiently. If the clusters are made large enough, there is only need of one single layer of clusters to achieve the same effect as in the prior art dye-sensitized solar cells. Thus, the light absorbing layer of the invention can be made significantly thinner.

In the past decades, several thousands of different dyes have been synthesised and tested in DSSC devices. Known dye molecules can be used for forming clusters and crystalline clusters with a bandgap that differs from the HOMO/LUMO gap of the single dye molecules. This makes it possible to produce light absorbing layer with different bandgaps. For example, it is possible to produce clusters with bandgaps in the interval of 1.0-1.6 eV. Thus, it is possible to optimize the bandgap of the light absorbing layer of the photovoltaic device with regards to the specific light spectrum that is to be converted into electricity.

In one aspect, a mixture of two or more dyes is used in the clusters of the light absorbing layer.

In one aspect, spaces are formed between the clusters, and the working electrode comprises a conducting medium that fills the spaces between the clusters in the light absorbing layer. The conducting medium transfers charges to/from the clusters in the working electrode.

In one aspect, the clusters forming the light absorbing layer is essentially a monolayer of clusters. The clusters absorb the incident light and uses the energy in the light to excite electrons. In this aspect, the clusters are arranged in a single layer so that each of the clusters directly faces unrestricted incident light. With unrestricted incident light is meant that the light is coming directly from the source of light, such as the sun or a lamp, and the light is not obscured by other clusters disposed on top of the clusters in the single layer. It is advantageous to have a single layer of cluster since each cluster will face the incident light and will contribute to the conversion of the incident light into electricity. If the light absorbing layer comprises more than one layer of clusters arranged on top of each other, the clusters in the upper layers will obscure the clusters in the lower layers so that they will not contribute as much to the light conversion. Further, if the light absorbing layer has only one single layer of clusters, the thickness of the light absorbing layer can be reduced. The thickness of the light absorbing layer is substantially equal to the thickness of the clusters in the single layer of clusters.

In one aspect, at least 40% of the clusters forming the light absorbing layer are crystalline clusters, where the dye molecules within the clusters are arranged in a defined and repeatable way, and preferably at least 50% of the clusters are crystalline clusters, and most preferably at least 70% of the clusters are crystalline clusters.

The clusters with a crystalline structure or at least a partly crystalline structure of dye molecules, hereinafter called crystalline clusters, have some specific advantages. The properties of the single dye molecules change when the dye molecules are arranged into a crystal. For example, the single dye molecules have a HOMO/LUMO gap. However, a crystalline cluster has a bandgap that depends on the type of dye molecules in the cluster. A smaller bandgap, compared to the HOMO/LUMO gap, will broaden the light absorption spectrum of the crystalline cluster, as compared to single dye molecules. A broader light absorption spectrum means that the crystalline cluster has a capability to absorb light in a broader wavelength range, as compared to the single dye molecules. The light harvesting capability is thereby increased for the crystalline cluster compared to a structure in which the same amount and type of dye molecules are arranged as single molecules absorbed in a scaffolding structure.

In a working electrode where the light absorbing layer comprise crystalline clusters, at least 40%, 45% or 50% of the cluster shall be crystalline clusters. Preferably, at least 70% or 80% of the clusters in the light absorbing layer shall be crystalline clusters, and most preferably, at least 90% of the clusters are crystalline clusters.

An advantage of crystalline clusters in addition to the advantages listed above is the possibility to design solar cells with specific light absorption spectrum. This enables the solar cell to be tailor-made for a specific use having specific light conditions. The possibility to have different types of dye molecules in a crystalline cluster will further enhance the flexibility of designing a solar cell.

In some aspects, the conductive layer is in direct physical and electrical contact with the light absorbing layer. This means that at least some of the clusters are in physical contact with the conductive layer.

In some aspects, the clusters forming the light absorbing layer are in physical and electrical contact with the conductive layer and the clusters are bonded to the conductive layer. The light absorbing layer is arranged in electrical contact with a conductive layer so that the conductive layer receives photo-generated chargers from the clusters. In an embodiment where the clusters are in direct physical and electrical contact with the conductive layer, the clusters are bonded to the conductive layer. The clusters within the light absorbing layer need not be bonded to each other.

In one aspect, the clusters are arranged in a single layer along the conductive layer, and each cluster is in physical and electrical contact with the conductive layer.

The conductive layer is preferably a porous layer of sintered metallic particles. The particles may also be other types of conductive particles, like particles of conducting glass, carbon or semi-conducting materials.

In some aspects, at least 80% of the clusters comprise more than 100 dye molecules per cluster. Preferably, the at least 80% of the clusters comprise more than 1000 dye molecules per cluster. Most preferably, at least 80% of the clusters comprise more than 10 000 dye molecules per cluster. Thus, the light absorbing layer will contain sufficient amounts of dye to absorb a substantial part of the incoming light for conversion to electricity for most types of dye.

A sufficiently large number of dye molecules ensures sufficient light absorption. The larger the number of dye molecules, the better light absorption is achieved. To achieve the same light absorption as the known dye-sensitized solar cells, the light absorbing layer should contain roughly the same number of dye molecules per unit surface area as the known dye-sensitized solar cells. If the clusters contain a smaller number of molecules, the light absorbing layer may contain more than one layer of clusters to ensure that the light absorbing layer will contain sufficient amounts of dye. The larger the clusters, the less number of cluster layers of are needed in the light absorbing layer.

In some aspects, the size of at least 80% of the clusters having more than 100 dye molecules is more than 5 nm along a straight line through a cluster connecting two points on the surface of the cluster. The straight line is, for example, the diameter of a round cluster or the z-axis of a cubic lattice of a crystalline cluster.

For larger clusters the size of at least 80% of the clusters can be more than 10 nm along a straight line through the cluster connecting two points on the surface of the cluster. Most preferably, the size of at least 80% of the clusters is more than 20 nm along a straight line through the cluster connecting two points on the surface of the cluster. The desired size of the clusters depends on the type of dye and its absorptions coefficient. The larger size of the clusters, the better the light absorption.

In some aspects for larger clusters, the size of at least 80% of the clusters is less than 2 μm along a straight line through a cluster connecting two points on the surface of the cluster. Preferably, the size of at least 80% of the clusters is less than 1 μm. Thus, the thickness of the light absorbing layer will be thin. The thickness of the light absorbing layer depends on the size of the cluster. The light absorbing layer is essentially a monolayer of clusters. For a the light absorbing layer containing one single layer of clusters, the thickness of the light absorbing layer is substantially equal to the thickness of the clusters.

Suitably, the size of at least 80% of the clusters is between 5 nm and 2 μm at a straight line connecting two points on the surface of the cluster. Preferably, the size of at least 80% of the clusters is between 10 nm and 1 μm at a straight line connecting two points on the surface of the cluster. Thus, the light absorbing layer can be designed to contain sufficient amounts of dye to absorb a substantial part of the incoming light of various light conditions for conversion to electricity, and the light absorbing layer will be thin.

According to some aspects, the dye molecules are organic dye molecules, organometallic dye molecules or natural dye molecules.

In one aspect, the dye is selected from a group comprising or consisting of organic dyes such as tetrahydroquinolines, pyrolidine, diphenylamine, triphenylamine (TPA), coumarin dyes, indole dyes, aryl amine dyes, porphyrine dyes, fluorine dyes, carbazole dyes (CBZ), phenothiazine dyes (PTZ), phenoxazine dyes (POZ), hemicyanine dyes, merocyanine dyes, squaraine dyes, perylene dyes, anthraquinone dyes, boradiazaindacene (BODIPY) dyes, oligothiophene dyes, and polymeric dyes, and fluorinated quinoxaline dyes. It has been found that organic dyes can improve the performance of DSSC devices. By using clusters of crystalline organic dyes, the band gap can be reduced resulting in light absorption in a broader wavelength range and more efficient light absorption of longer wavelengths of light.

In another aspect, the dye is selected from a group comprising or consisting of natural dyes such as betalain dyes, anthocyanin dyes [268], chlorophyll dyes [269], flavonoid dyes [270], and carotenoid dyes.

Metal organic dyes are well known photovoltaic materials having good light absorption and which are tailor made for efficient absorption of visible light. Examples of organometallic dyes can be the commonly used dyes of ruthenium (Ru) bipyridyl derivatives (N3: cis-diisothiocyanato-bis(2,2'-bipyridyl-4,4'-dicarboxylic acid) ruthenium(II); N719: di-tetrabutylammonium cis-bis(isothiocyanato)bis(2,2'-bipyridyl-4,4'-dicarboxylato) ruthenium(II); Z907: cis-bis (isothiocyanato)(2,2'-bipyridyl-4,4'-dicarboxylato)(4,4'-dinonyl-2'-bipyridyl).

In a third aspect, the dye is selected from a group comprising or consisting of organometallic dye molecules, such as metal organic complexes, for example, ruthenium based complexes or other metal complexes such as iron complexes or platinum complexes.

Other types of dyes can be metal-free organic dyes, like for example eosin Y, aniline blue, bromophenol blue, alcian blue, methyl orange, crystal violet, fast green, and carbol fuchsin.

Also, natural dyes like for example anthocyanin, carotenoid, flavonoid or chlorophyll pigments can be considered for us in a solar cell.

The dye molecules suitable for use in the present invention, is not limited to the examples given above.

One way of determining what dye could be suitable for a desired use in a solar cell, is to measure the luminescence of the dye. A light "echo" from the measurement corresponding to the incident light without weakening light intensity or shifting of the light can be an indication of the suitability of the dye.

In some aspects, the clusters may comprise a kernel or a seed of a different material. The clusters may contain a small kernel of another material used during manufacturing of the clusters to start the crystallisation process. The crystals are grown on the seed/kernel to form crystalline clusters. An advantage of using a kernel during the manufacturing process is that the clusters can be spherical and of substantially equal size. This facilitates the manufacturing of the light absorbing layer and makes it possible to achieve a more homogeneous layer. Another advantage of using a kernel is that it is possible to achieve a narrower size distribution of the clusters. A narrow size distribution is useful in cases where it is necessary to control the size of the clusters very precisely.

In some aspects, the clusters are substantially evenly distributed in the light absorbing layer. This provides for an even conversion of incident light over the entire surface of the light absorbing layer. An even distribution of the clusters also results in a large active surface area for conversion of light to electricity. With evenly distributed is meant that the number of clusters per $cm^2$ is the same or substantially the same over the entire area of the light absorbing layer. With substantially evenly distributed is meant that the number of clusters per $cm^2$ may vary ±10% between different parts of the light absorbing layer.

In some aspects, the thickness of the light absorbing layer is less than or equal to 2 μm, and preferably less than or equal to 1 μm. The present invention provides for an efficient light absorbing layer with a thickness less than or equal to 2 μm. The optimal thickness of an efficient light absorbing layer depends both on the light absorption spectrum of the dye and the light emission spectrum of the light source. This improves flexibility for the use of the photovoltaic device, because the light absorbing layer can be designed to obtain an optimum balance between the light absorption spectrum of the dye and the light emission spectrum of the light source.

In some aspects, the thickness of the light absorbing layer is between 20 nm and 2 μm.

In some aspects, the working electrode comprises a reflective layer arranged on an opposite side of the light absorbing layer with respect to the upper surface. The reflective layer is disposed between the light absorbing layer and the first conductive layer. The light absorbing layer including the clusters is arranged on top of the reflective layer. The reflective layer comprises semiconducting particles in electrical contact with the clusters and the first conductive layer. The semiconducting particles are made of a reflective material, i.e. a material that reflects light. The reflective layer reflects light back to the light absorbing layer. The semiconducting particles are attached to each other and form the reflective layer. The reflective layer acts as a mirror that scatters incident light back into the light absorption layer thereby increasing the effective absorption path length, and accordingly increasing the light absorption of the light absorbing layer. The light scattering effect of the reflective layer is wavelength dependent and the light scattering effect depends strongly on the sizes of the semiconducting particles in the reflective layer. Thus, the light scattering can be tuned and optimized by choosing semiconducting particles with adequate particle sizes to suit the application of the photovoltaic device at hand. The semiconducting particles are in electrical contact with the conductive layer as well as the light absorbing layer. Thus, the clusters are in electrical contact with the conductive layer via the semiconducting particles.

The semiconducting particles in the reflective layer are designed so that they will reflect the light. In some aspects, the size of at least 80% of the semiconducting particles, or agglomerates of the semiconducting particles, in the reflective layer is larger than 0.1 μm, and preferably larger than 0.2 μm. The larger particles the better they will reflect the light. If the semiconducting particles are smaller than 0.1 μm, their ability to reflect light is poor.

In one aspect, the size of at least 80% of the semiconducting particles is between 0.1 μm and 2 μm. This will improve the light scattering ability of the semiconducting particles.

In some aspects, the semiconducting particles are made of titanium dioxide ($TiO_2$). It is advantageous to use titanium dioxide, since it reflects light well without absorbing the light. Titanium oxide has a high refractive index, and a bandgap sufficiently large to avoid absorption of light. Further, titanium dioxide is sufficiently electrically conducting so that the reflective layer can efficiently transfer the photoexcited charges received from the light absorbing layer to the conductive layer.

In some aspects, the thickness of the reflective layer is between 0.1 μm and 10 μm. Preferably, the thickness of the reflective layer is between 1 μm and 10 μm. Thus, the reflective layer is sufficiently thin to achieve small electrical energy losses during transfer of the photoexcited charges from the light absorbing layer to the conductive layer.

Preferably, the reflective layer is porous to allow a conducting medium to pass through the reflective layer.

In some aspects, the porosity of the reflective layer is between 40%-70%. It is important that the reflective layer is sufficiently porous, such that the conducting medium can form a continuous conducting path through the pores inside the reflective layer.

In some aspects, the light absorbing layer and the reflective layer overlap, such that a part of the clusters are disposed in pores formed between the semiconducting particles. An advantage with the light absorption layer penetrating inside the reflective layer is that the effective light absorption path length can be increased leading to higher light absorption.

In this case, it is particularly advantageous to use titanium dioxide ($TiO_2$) in the semiconducting particles, since titanium dioxide is party transparent and allows light to reach the clusters disposed inside pores of the of the reflective layer.

The clusters that may be disposed in the pores between semiconducting particles are preformed clusters of dye molecules that are not dye molecules being infused into the semiconducting structure in order to attach to the semiconducting scaffolding structure, whether some of these dye molecules form agglomerates or not.

In some aspects, pore size of the reflective layer is between 10 nm and 1 μm. Thus, the pores in the reflective layer are sufficiently large to accommodate both the clusters and the conducting medium in the pores of the reflective layer.

In another aspect, the aim of the invention is achieved by a photovoltaic device comprising the working electrode according to the invention.

The photovoltaic device comprises a working electrode according to the invention, a counter electrode, and a conducting medium for transferring charges between the counter electrode and the working electrode. The photovoltaic device can be a solar cell.

In some aspects, the photovoltaic device comprises a porous insulation substrate, wherein the conductive layer is a porous conductive layer formed on one side of the porous insulation substrate. The counter electrode may further comprise a second conductive layer arranged on the opposite side of the porous insulation substrate. In some aspects, the clusters are evenly distributed on the surface of the first conductive layer.

In some aspects, the conducting medium is an ionic based electrolyte for transferring the photo-excited electrons from the counter electrode to the working electrode, which can also include gel polymer electrolytes. A hole conducting medium is also a possible conductive medium.

In addition to the several advantages with a photovoltaic device having a working electrode in accordance with the invention mentioned above, the surface of the light absorbing layer may also become rougher, which rougher surface increases the probability for reflected light to be absorbed. This in turn reduces efficiency losses due to reflections in the surface. A rougher surface provides for a multitude of angels towards the incident light, the efficiency of the photovoltaic device does not depend critically on the angle of incidence of the light with respect to the layer. Thus, the optical losses are reduced compared to known dye-sensitized solar cells.

BRIEF DESCRIPTION OF THE DRAWINGS

The invention will now be explained more closely by the description of different embodiments of the invention and with reference to the appended figures.

DETAILED DESCRIPTION

Like numbers in the figures refer to like elements throughout the description.

Figure 1:
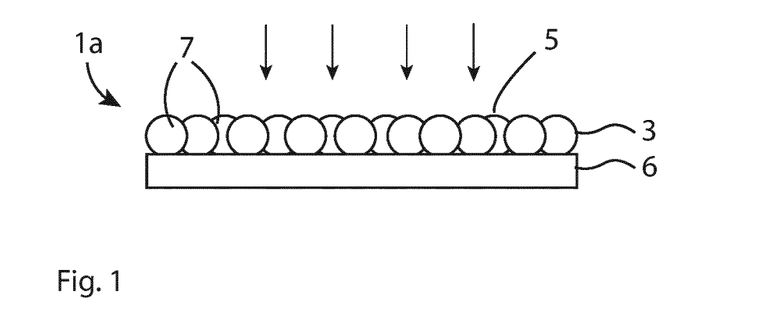
FIG. 1 shows one example of a working electrode including a light absorbing layer.

FIG. 1 shows a schematic drawing of a working electrode 1a including a light absorbing layer 3 made of a light absorbing photovoltaic material and a conductive layer 6 in electrical contact with the light absorbing layer 3. The light absorbing layer 3 has an upper surface 5 for receiving incoming light. The conductive layer 6 is arranged on an opposite side of the light absorbing layer 3 with respect to the upper surface 5. In this example, the light absorbing layer 3 is disposed directly on the conductive layer 6. The light absorbing photovoltaic material consists of a plurality of dye molecules. The dye molecules form clusters 7. The dye molecules within a cluster 7, are arranged so that each dye molecule is bonded to its adjacent dye molecules. The clusters 7 are disposed on the surface of the conductive layer 6 and essentially every cluster 7 is bonded to the conductive layer 6. The clusters 7 shall cover a large part of the area of the light absorbing layer 3 and need not be bonded to each other. Preferably, the light absorbing layer 3 is porous to allow a conducting medium to pass through the light absorbing layer. To achieve sufficient light absorption most of the clusters may comprise more than 100 dye molecules, preferably more than 1000 dye molecules, and most preferably more than 10 000 dye molecules. Each dye molecule in a cluster is bonded to its adjacent dye molecules.

The dye can be any type of dye with the ability to absorb photons, and to generate photo-excited electron. There exist several thousands of known types of dyes with the ability to absorb photons and generate photo-excited electron. The dye molecules can be organic dye molecules, organometallic dye molecules, or natural dye molecules. Metal organic dyes are well known photovoltaic materials having good light absorption and which can be tailor made for efficient absorption of visible light.

Examples of organic dyes: tetrahydroquinolines, pyrolidine, diphenylamine, triphenylamine (TPA), coumarin dyes, indole dyes, aryl amine dyes, porphyrine dyes, fluorine dyes, carbazole dyes (CBZ), phenothiazine dyes (PTZ), phenoxazine dyes (POZ), hemicyanine dyes, merocyanine dyes, squaraine dyes, perylene dyes, anthraquinone dyes, boradiazaindacene (BODIPY) dyes, oligothiophene dyes, and polymeric dyes, fluorinated quinoxaline dyes. It has been found that organic dyes can improve the performance of DSSC devices. By using clusters of crystalline organic dyes, the band gap can be reduced resulting in light absorption in a broader wavelength range and more efficient light absorption of longer wavelengths of light.

Examples of metal organic dyes: ruthenium-based complexes, or other metal complexes such as iron complexes or platinum complexes.

Examples of natural dyes: betalain dyes, anthocyanin dyes [268], chlorophyll dyes [269], flavonoid dyes [270], carotenoid dyes.

The dye molecules suitable for use in the present invention, is not limited to the examples given above. Further, the dye molecules in the clusters can be a mixture of two or more dyes.

Suitably, the clusters 7 are substantially evenly distributed in the light absorbing layer 3 to achieve an even conversion of incident light over the entire surface of the light absorbing layer 3. The clusters can be in physical contact with each other, but they do not need to be bonded to each other. The clusters 7 are typically bonded to another layer arranged underneath the light absorbing layer 3, for example, the conductive layer 6. The conductive layer 6 is arranged in electrical contact with the clusters 7. In this example, the conductive layer 6 is arranged in electrical as well as physical contact with the clusters 7.

The desired size of the clusters 7 depends on the type of dye and its absorptions coefficient. The larger size of the clusters, the better light absorption. The shape and size of the clusters 7 may be varied by the method used for producing the clusters. To achieve a good ability to absorb light, the size of at least 80% of the clusters preferably is more than 5 nm along a straight line through the cluster connecting two points on the surface of the cluster. For example, the line is the diameter of the clusters. More preferably, the size of at least 80% of the clusters along a straight line through the cluster is more than 10 nm, and most preferably more than 20 nm. Suitably, the size of at least 80% of the clusters is between 5 nm and 2 µm at a straight line connecting two point on the surface of the cluster. Preferably, the size of at least 80% of the clusters is between 10 nm and 1 µm at a straight line connecting two point on the surface of the cluster. The size of the clusters is, for example, measured by using SEM "Scanning Electron Microscopy".

For example, the clusters 7 are arranged so that they form a monolayer of clusters 7 in the light absorbing layer 3, as shown in FIG. 1. Each of the clusters 7 in a monolayer has an upper surface facing the incoming light and accordingly can contribute to the light conversion.

The optimal thickness for an efficient light absorbing layer depends both on the light absorption spectrum of the dye and the light emission spectrum of the light source. For example, the thickness of the light absorbing layer 3 is less than or equal to 2 µm, and preferably less than or equal to 1 µm. For example, the thickness of the light absorbing layer is larger than 20 nm. The thickness of the light absorbing layer mainly depends on the thickness of the clusters 7. Suitably, the thickness of the light absorbing layer is between 20 nm and 2 µm.

Figure 3:
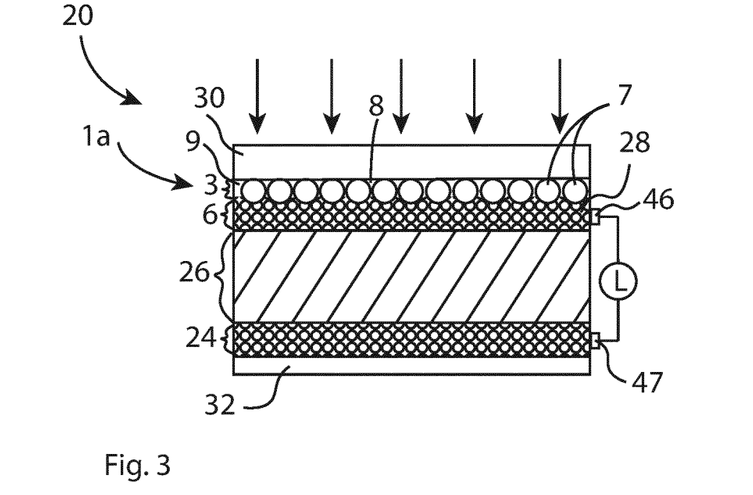
FIG. 3 shows an example of a photovoltaic device including the working electrode shown in FIG. 1.
Figure 5:
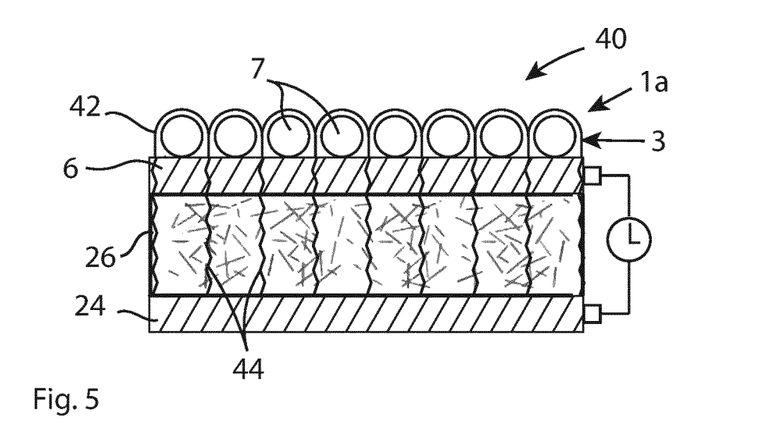
FIG. 5 shows another example of a photovoltaic device including the working electrode shown in FIG. 1.

The light absorbing layer 3 may further include a conducting medium 9, as shown in FIG. 3. Spaces 8 are formed between the clusters 7 for housing the conducting medium. For example, the conducting medium 9 can be a liquid electrolyte, or a solid charge conducting material, such as a conducting polymer. The conducting medium 9 is disposed in the spaces 8 between the clusters 7. For example, the clusters 7 can be partly covered with the charge conducting material 42, as shown in FIG. 5. Preferably, the conductive layer 6 is also porous to allow the conducting medium 9 to penetrate through the conductive layer 6. The conductive layer 6 is made of a conducting material. For example, the conductive layer 6 is made of porous Ti.

The working electrode may comprise a connection element 46 electrically connected to the conductive layer 6 for connecting the conductive layer to an external load as shown in FIG. 3.

In the example of FIG. 1, the clusters 7 are disposed on the conductive layer 6. The conductive layer 6 extracts the photo-generated electrons from the light absorbing layer 3. The clusters 7 are bonded to the conductive layer 6. The clusters 7 can be in physical contact with each other, but they are not bonded to each other. In this example, the clusters are disposed on the first conductive layer 6 so that they form a monolayer of clusters 7 on the conductive layer 6. The clusters 7 have an upper surface facing the light and a lower surface being in direct mechanical and electrical contact with the conductive layer 6. In a monolayer of clusters, each of the clusters are in direct physical and electrical contact with another layer arranged underneath the light absorbing layer 3, for example, the first conductive layer 6.

Figure 2:
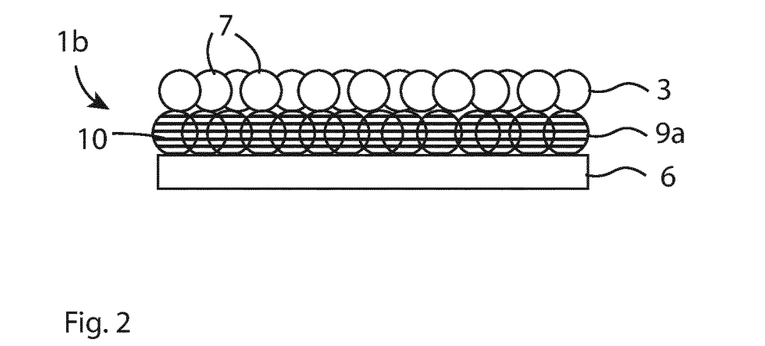
FIG. 2 shows another example of a working electrode including a light absorbing layer and a reflective layer.

FIG. 2 shows another example of a working electrode 1*b* including the light absorbing layer 3, the conductive layer 6 and a reflective layer 9*a* arranged between the light absorbing layer 3 and the conductive layer 6. The reflective layer 9*a* is arranged on an opposite side of the light absorbing layer 3 with respect to the upper surface 5. The light absorbing layer is arranged on top of the reflective layer 9*a*, and the reflective layer 9*a* is arranged on top of the conductive layer 6. The reflective layer 9*a* is arranged so that it reflects light having passed from the light absorbing layer 3 back to the light absorbing layer 3. The reflective layer 9*a* comprises semiconducting particles 10 in electrical contact with the clusters 7 and with the conductive layer 6. It is important that the reflective layer forms a good electric contact with the light absorbing layer so that the light absorbing layer can transfer photoexcited charges to the reflective layer without significant electrical energy losses.

The semiconducting 10 particles are made of a reflective material, i.e. a material that reflects light. The semiconducting particles 10 are in electrical contact with the conductive layer 6 as well as the light absorbing layer 3. Thus, the clusters 7 are in electrical contact with the conductive layer 6 via the semiconducting particles 10. The semiconducting particles 10 are bonded to each other and to the conductive layer. The semiconducting particles are, for example, made of $TiO_2$, ZnO, or Nb2O5. Suitably, the size of at least 80% of the semiconducting particles 10 is between 10 nm and 2 µm. For example, the semiconducting 10 particles are made of titanium dioxide ($TiO_2$). The reflective layer act as a mirror that scatters incident light back into the light absorption layer thereby increasing the effective absorption path length, and accordingly increases the light absorption of the light absorbing layer. The light scattering effect of the reflective layer is wavelength dependent. The light scattering effect depends strongly on the sizes of the semiconducting particles 10 in the reflective layer. Thus, the light scattering can be tuned and optimized by choosing semiconducting particles with adequate particle sizes to suit the application at hand.

In this example, the clusters 7 are disposed on the reflective layer 9*a*. At least some of the semiconducting particles 10 are in physical contact with at least some of the clusters 3. In this example, the clusters 7 are bonded to the semiconducting particles 10 of the reflective layer 9*a*. For example, the clusters are disposed on the reflective layer 9*a* so that they form a monolayer of clusters 7 on the reflective layer, as shown in FIG. 2. Preferably, the reflective layer is porous to allow the conducting medium to pass through the reflective layer. For example, the porosity of the reflective layer is between 35%-80% or 40%-70%. The thickness of the reflective layer is between 0.1 µm and 10 µm, and preferably between 1 µm and 10 µm.

It is also possible that some clusters 7 are placed within pores of the reflective layer 9*a*. These clusters 7 are prepared to be clusters 7 in accordance with the description above and are not formed by for example excess dye forming an agglomeration as dye is infused into a semi-conducting structure.

In all possible embodiments of a working electrode 1a the main part of the light absorbing layer 3 is the monolayer of clusters 7 disposed on the surface of the conductive layer 6 or the reflective layer 9a.

FIG. 3 shows an example of a photovoltaic device 20 comprising the working electrode 1a, as shown in FIG. 1. The photovoltaic device comprises a counter electrode comprising a second conductive layer 24 electrically insulated from the first conductive layer 6, and a conducting medium 9 for transferring charges between the counter electrode and the working electrode. The conducting medium 9 is disposed in the spaces 8 between the clusters 7.

Figure 4:
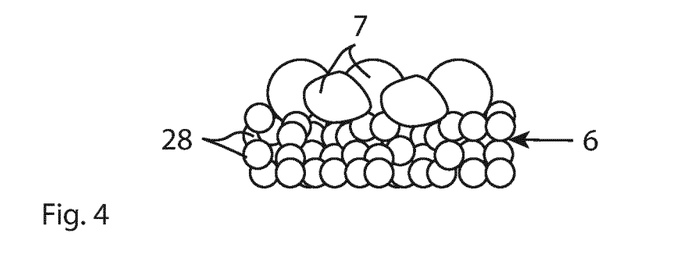
FIG. 4 shows an enlarged part of the light absorbing layer and a conductive layer of the photovoltaic device shown in FIG. 3.

The photovoltaic device 20 further comprises an insulating substrate 26 arranged between the first and second conductive layers 6, 24. The first conductive layer 6 is disposed on one side of the insulating substrate 26, the second conductive layer 6 is disposed on the opposite side of the insulating substrate 26. The light absorbing layer 3 is disposed on the first conductive layer 6. The light absorbing layer 3 is positioned on a top side of the photovoltaic device facing the sun to allow the sunlight to hit the clusters 7 and to generate photo-exited electrons. The first conductive layer 6 serves as a back contact that extracts the photo-generated electrons from the light absorbing layer 3. Preferably, the first conductive layer 6 is porous for housing the conducting medium. For example, the first conductive layer 6 comprises a plurality of conducting particles 28 made of a conducting material, as shown in FIG. 4. The conductive particles 28 of the first conductive layer are bonded to each other and are in electrical contact with each other. The first and second conductive layers 6, 24 are, for example, made of Ti, Ti alloys, Ni alloys, graphite, or amorphous carbon. Preferably, the first and second conductive layers 6, 24 are made of porous Ti.

FIG. 4 shows an enlarged part of the light absorbing layer and the first conductive layer 6 of the photovoltaic device shown in FIG. 3. The conductive particles 28 of the first conductive layer 6 form a network for conducting electrical charges and for having a sufficient mechanical stability for the photovoltaic device. The clusters 7 of the light absorbing layer are in physical and electrical contact with some of the conducting particles 28 of the first conductive layer 6.

It is possible that some of the clusters 7 partly protrudes into the first conductive layer 6. In this example, the clusters 7 are larger than the conducting particles 28. However, the clusters 7 and the conducting particles 28 can also be of substantially equal size.

The photovoltaic device 20 further comprises a conducting medium for transferring charges from the light absorbing layer 3 to the second conductive layer 24. In this example, the conducting medium is a liquid electrolyte and not shown in the figure. However, the conducting medium can be any suitable type of conducting medium, such as a gel or a solid conductor. The liquid electrolyte is, for example, a redox electrolyte capable of transferring charges i.e. electrons or holes to or from the clusters 7. The redox electrolyte is also capable of transferring charges to or from the second conductive layer 24. Examples of electrolytes include the $I^-/I_3^-$ redox couple or ferrocene compound containing electrolytes, however also other electrolytes such as copper based electrolytes or cobalt based electrolytes can be used. The electrolyte may be selected from a group comprising or consisting of Iodine/iodide-based electrolytes such as:
LiI/I2, NaI/I2, KI/I2, PMII/I2,
or cobalt-based electrolytes such as:
Tris(1,10-phenanthroline)cobalt bis(hexafluorophosphate)/Tris(1,10-phenanthroline)cobalt tris(hexafluorophosphate), or
Bis(6-(1H-pyrazol-1-yl)-2,2'-bipyridine)cobalt bis(hexafluorophosphate)/Bis(6-(1H-pyrazol-1-yl)-2,2'-bipyridine)cobalt tris(hexafluorophosphate), or
Tris-(2,2'-bipyridine)cobalt(II) di(tetracyanoborate)/Tris-(2,2'-bipyridine)cobalt(III) tri(tetracyanoborate),
Or copper-baser electrolytes such as
bis-(2,9-dimethyl-1,10-phenanthroline)copper(I) bis(trifluoromethanesulfonyl)imide/bis-(2,9-dimethyl-1,10-phenanthroline)copper(II)bis(trifluoromethanesulfonyl) imide chloride, or
bis-(4,4',6,6'-tetramethyl-2,2'-bipyridine)copper(I) bis(trifluoromethanesulfonyl)imide/bis-(4,4',6,6'-tetramethyl-2,2'-bipyridine)copper(II) bis[bis(trifluoromethanesulfonyl)imide], or
Bis(1,1-Bis(2-pyridyl)ethane)copper(I) hexafluorophosphate/Bis(1,1-Bis(2-pyridyl)ethane)copper(II) bis (hexafluorophosphate).

Also hole transport materials can be used (HTM) as the conducting medium.

The porosity of the insulating substrate 26 will enable ionic transport through the insulating substrate. The porosity of the first conductive layer 6 will enable ionic transport through the first conducing layer. For example, the substrate 26 and the applied layers 3, 6, 24 is immersed in a liquid electrolyte and encapsulated. The liquid electrolyte is filled in the pores of the first porous conductive layer 6, in pores of the porous insulating substrate 26, and in the spaces between the clusters 7 in the light absorbing layer 3. The first and second conductive layers 6, 24 are separated physically and electrically by the insulating substrate 26 and therefore the conductive layers 6, 24 are not in direct physical or electrical contact. However, the first and second conductive layers 6, 24 are electrically connected via electrolyte ions penetrating the porous insulating substrate.

The photovoltaic device 20 also comprises a casing or other means for enclosing the photovoltaic device for protection of the device and to prevent leakage of the electrolyte. For example, the photovoltaic device 20 comprises a first sheet 30 covering a top side of the photovoltaic device and a second sheet 32 covering a bottom side of the photovoltaic device and acting as liquid barriers for the electrolyte. The first sheet 30 on the topside of the photovoltaic device needs to be transparent to allow light to pass through. The sheets 30, 32 are, for example, made of a polymer material. An additional layer may be added between the counter electrode 24 and the bottom sheet covering 32, in order to further support the mechanical stability of the photovoltaic device. The photovoltaic device 20 comprises at least one connection element 46 electrically connected to the first conductive layer 6 for connecting the first conductive layer to an external circuit L, and at least one connection elements 47 electrically connected to the second conductive layer 24 for connecting the second conductive layer to the external circuit L. For example, the connection elements 46, 47 are busbars. The first and second conductive layers 6, 24 are connected to each other through the external circuit L. Thus, an electrical circuit is formed, where one type of charge carrier, i.e. electrons or holes, are transported from the first conductive layer 6 to the second conductive layer 6 via the external circuit, and the other type of charge carrier, i.e. electrons or holes, are transported from the first conductive layer 6 to the second conductive layer 24 via the charge conducting medium.

FIG. 5 shows another example of a photovoltaic device 40 including the working electrode 1a. The photovoltaic device 40 includes a porous insulation substrate 26, and a counter electrode including a second conductive layer 24. In this example, the conducting medium is a solid charge conductor 42. The light absorbing layer 3 comprises the clusters 7 of dye molecules and the solid charge conductor 42. The charge conductor 42 can be a hole conductor or an electron conductor. For example, the charge conductor 42 is a conductive polymer, such as PEDOT, poly (3,4-ethylenedioxythiophene)-poly (styrene sulfonate) called PEDOT:PSS. The clusters 7 are essentially evenly distributed in the light absorbing layer 3, and the solid charge conductor 42 is located on the clusters 7 and in the spaces between the clusters. The photovoltaic device 40 further comprises a plurality of charge conducting paths 44 of a charge conducting material disposed between the light absorbing layer 3 and the second conductive layer 24 to enable charges, i.e. holes or electrons, to travel between the light absorbing layer 3 and the second conductive layer 24. The conducting paths 6 penetrate through the first conductive layer 6 and the porous insulating substrate 26. Suitably, the first conductive layer 6 is porous to allow the charge conductor to penetrate through the first conductive layer 6.

Figure 6:
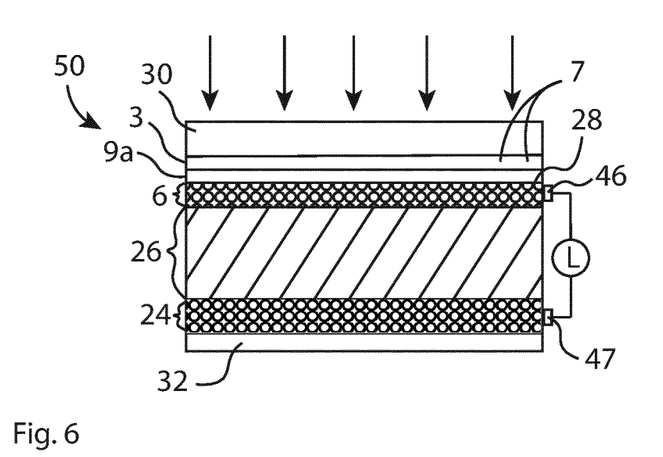
FIG. 6 shows an example of a photovoltaic device including the working electrode shown in FIG. 2.

FIG. 6 shows an example of a photovoltaic device 50 including the working electrode 1b shown in FIG. 2.

The light absorbing layer can be manufactured in many different ways. For example, the clusters can be manufactured beforehand, and a solution containing the clusters is deposited on the conductive layer of the photovoltaic device. The clusters can, for example, be crystals of dye produced beforehand. Alternatively, a solution containing dye molecules is deposited on the conductive layer of the photovoltaic device and the clusters are formed during drying of the conductive layer covered with the solution. The dye molecules are bonded to each adjacent dye molecule and form clusters during the drying. If the conductive layer covered with the solution is heated during the drying, the dye molecules can be bonded to each other so that they form clusters of dye crystals on the surface of the conductive layer.

In one aspect, the method comprises producing a solution including dye molecules and/or clusters of dye molecules distributed in a solvent, distributing the solution on the conductive layer, and drying the conductive layer provided with the solution until the solvent has evaporated. For example, the coating may be made by spraying. Alternatively, the coating can be made by electro-spraying. The method may comprise heating the conductive layer provided with the solution to achieve crystallization of the clusters of dye molecules. This method for producing the light absorbing layer is simple, fast and provides an even distribution of the clusters on the surface of the conductive layer. The solution may contain dye molecules solved in the solvent. For example, dye powder is dissolved in the solvent to form a solution comprising dye molecules. In such case, the dye molecules will bond to each other and form clusters during the drying. Alternatively, clusters of a desired size can be manufactured beforehand. The clusters are then added to the solvent to form the solution. The clusters are distributed on the surface of the conductive layer during the coating. Alternatively, the solution comprises clusters of dye molecules as well as dye molecules solved in the solvent. This can be advantageous since the dye molecules may act as a glue between the clusters, and between the clusters and the conductive layer so that the clusters will attach to each other and to the conductive layer.

Example 1

In this example, the clusters are formed directly on top of the conductive layer 6.

In a first step, a dye solution is manufactured by dissolving a solid dye, e.g., in the form of a powder of dye in a suitable solvent that dissolves the solid dye. Consequently, a solution of dye molecules dissolved in a solvent is being formed. In one example the dye is an arylamine dye, for example, (E)-3-(5-(4-(bis(2',4'-dibutoxy-[1,1'-biphenyl]-4-yl)amino)phenyl)thiophen-2-yl)-2-cyanoacrylic acid (also abbreviated as D35). The solvent may be any organic solvent that has the capability to dissolve the dye, such as for example methylene chloride, acetonitrile, NMP, DMF, THFA, butyrolactone, or DMSO, methanol.

In a second step, an upper surface of a conductive layer comprising porous Ti is coated with the solution. For example, the coating of the upper surface of the conductive layer is carried out by spraying the solution on the conductive layer.

In a third step, the conductive layer provided with the solution is dried until the solvent has been evaporated and a plurality of clusters of dye molecules is formed on the conductive layer. In this example, the clusters are boned to the conductive layer during the formation of the clusters on the conductive layer, i.e. during the evaporation of the solvent.

In this example, the solution comprises dye molecules solved in the solvent, and the clusters are achieved after the solution has been applied to the surface of the conductive layer.

Example 2

In a first step, a dye solution is manufactured by dissolving a solid dye, e.g., in the form of a powder of dye in a suitable solvent that dissolves the solid dye. Consequently, a solution of dye molecules dissolved in a solvent is being formed. The dye and the solvent can be the same as in example 1.

In a second step, the dye molecules in the solution are being precipitated into crystals consisting of crystalline clusters of dye molecules. The crystallization can be achieved in several ways. For example, the solvent can be removed to a level where the dye starts to precipitate because the solubility of the dye is too low. Alternatively, it is possible to precipitate the dye by adding precipitating agents like, e.g., salts.

In a third step, the solution including the crystalline clusters is deposited onto the conductive layer 6. It is advantageous to add dye molecules to the solution including the crystalline clusters before the solution is deposited onto the conductive layer 6.

In a fourth step, the conductive layer 6 provided with the solution is dried until the solvent has been evaporated and the crystalline clusters are distributed on the surface of the conductive layer. The added dye molecules will serve as a glue between the clusters and the conductive layer after the solvent has been evaporated so that the clusters are attached to the conductive layer.

In this example, the solution comprises clusters distributed in a solvent.

Example 3

The crystalline clusters can also be formed directly on top of the conductive layer 6.

In a first step a dye solution is manufactured by dissolving a solid dye, e.g., in the form of a powder of dye in a suitable solvent that dissolves the solid dye. The dye and the solvent can be the same as in example 1.

In a second step, an upper surface of the conductive layer is coated with the solution. For example, the coating of the upper surface of the conductive layer is carried out by spraying the solution on the conductive layer.

In a third step, the conductive layer provided with the solution is subjected to heating (annealing) for a certain amount of time, for example at 70° C. during three hours, so that the solvent evaporates to precipitate the solid dye into clusters on top of the conductive layer 6, and to achieve crystallization of the clusters. The annealing can be performed in air or in inert atmosphere like, e.g., argon or in vacuum. The solvent is evaporated during the heating.

The spraying and heating procedure can be repeated several times in order to achieve a layer of clusters, where the clusters are thick enough to efficiently absorb the light. It is possible to vary the concentration of the dye solution or the temperature during drying to achieve different qualities of the cluster layer. For example, a fast drying can result in smaller clusters and therefore a high drying temperature can result in fast evaporation of solvent, which can result in small clusters. By allowing the solvent to evaporate slowly it is possible to grow larger clusters on the conductive layer.

Example 4

Firstly, clusters are manufactured by precipitating dye in a crystalline structure from a dye solution by adding cations to the dye solution. The cations make the dye insoluble in the solvent and as a result the dye precipitates in the solution in the form of crystalline structure. The crystalline clusters are then separated from the solution by sedimentation and decantation. The crystalline clusters can also be separated from the solution more efficiently by centrifugation followed by decantation. Alternatively, the crystalline clusters can be separated from the solution by filtration through a filter, preferably by applying vacuum and sucking the liquid crystal mixture through the filter. Alternatively, the crystalline clusters can be separated from the solution by filtration and applying overpressure to the crystal liquid mixture, and thereby pressing the liquid through the filter leaving the crystals on the filter.

The crystalline clusters can, for example, be deposited on the conductive layer by spraying, vacuum suction, or electro-spraying.

Example 5

This example describes a method for manufacturing a working electrode having a reflective layer.

In a first step, a first solution is manufactured comprising $TiO_2$ and a solvent.

In a second step, an upper surface of a conductive layer made of porous Ti is coated with the first solution. For example, the coating of the upper surface of the conductive layer is carried out by spraying or printing the first solution on the conductive layer.

In a second step, the conductive layer provided with the first solution is dried until the solvent has been evaporated at a temperature between 50-80° C. and a layer of $TiO_2$ particles is formed on the first conductive layer. Further, the conductive layer provided with the $TiO_2$ particles are sintered, for example, for 15 minutes in about 500° C., to bond the $TiO_2$ particles to the conductive layer and to achieve electrical contact between the $TiO_2$ particles and the conductive layer.

In a third step, a second solution is manufactured by dissolving a solid dye, e.g., in the form of a powder of dye in a suitable solvent that dissolves the solid dye. The dye and the solvent can be the same as in example 1.

In a fourth step, the layer of $TiO_2$ particles is coated with the dye solution. For example, the coating is carried out by spraying the dye solution on the layer of $TiO_2$ particles.

In a fifth step, the conductive layer provided with $TiO_2$ particles and the dye solution is dried in between 50-80° C. until the solvent has been evaporated and a plurality of clusters of dye molecules are formed on the layer of $TiO_2$ particles. Further, the conductive layer provided with $TiO_2$ particles and the dye solution can be subjected to heating (annealing) for a certain time to increase the crystallinity of the precipitated clusters of dye molecules.

In another example, seeds of another material then the dye can be used during manufacturing of the clusters to start the crystallisation process. The crystals are grown on the seeds to form crystalline clusters. An advantage of using a seed during the manufacturing process is that the clusters can be spherical and of substantially equal size. This facilitates the manufacturing of the light absorbing layer and makes it possible to achieve a more homogeneous layer.

The present invention is not limited to the embodiments disclosed but may be varied and modified within the scope of the following claims. For example, the light absorbing layer may include small amounts of a second light absorbing photovoltaic material.

The invention claimed is:

1. A working electrode for a photovoltaic device, comprising:
    a light absorbing layer; and
    a conductive layer arranged in electrical contact with the light absorbing layer,
    wherein the light absorbing layer comprises a light absorbing photovoltaic material consisting of a plurality of dye molecules,
    wherein the light absorbing layer is formed by a layer of a plurality of clusters, whereby each cluster is formed by dye molecules and each dye molecule in the cluster is bonded to its adjacent dye molecules,
    wherein the light absorbing layer does not contain dye molecules disposed or absorbed on surfaces of semiconducting particles or a semiconducting layer,
    wherein the light absorbing layer is essentially a monolayer of the clusters,
    wherein spaces are formed between the clusters, and
    wherein the working electrode further comprises a conducting medium that fills the spaces between the clusters.

2. The working electrode according to claim 1, wherein the thickness of the light absorbing layer is between 20 nm and 2 μm.

3. The working electrode according to claim 1, wherein the dye molecules are organic dye molecules, or organometallic dye molecules, or natural dye molecules.

4. The working electrode according to claim 1, wherein said clusters are substantially evenly distributed in the light absorbing layer.

5. The working electrode according to claim 1, wherein the clusters forming the light absorbing layer are in physical and electrical contact with the conductive layer and the clusters are bonded to the conductive layer.

6. A photovoltaic device comprising:
a working electrode according to claim 1, and
a counter electrode,
wherein the conducting medium is configured to transfer charges between the counter electrode and the working electrode.

7. The working electrode according to claim 1, wherein at least 80% of the clusters forming the light absorbing layer comprises more than 10,000 dye molecules.

8. The working electrode according to claim 7, wherein at least 80% of the clusters forming the light absorbing layer comprises more than 1,000 dye molecules.

9. The working electrode according to claim 8, wherein at least 80% of the clusters forming the light absorbing layer comprises more than 100 dye molecules.

10. The working electrode according to claim 1, wherein at least 70% of the clusters forming the light absorbing layer are crystalline clusters, where the dye molecules within the clusters are arranged in a defined and repeatable way.

11. The working electrode according to claim 10, wherein at least 50% of the clusters forming the light absorbing layer are crystalline clusters, where the dye molecules within the clusters are arranged in a defined and repeatable way.

12. The working electrode according to claim 11, wherein at least 40% of the clusters forming the light absorbing layer are crystalline clusters, where the dye molecules within the clusters are arranged in a defined and repeatable way.

13. The working electrode according to claim 1, wherein the working electrode comprises a reflective layer disposed between the light absorbing layer and the conductive layer, and the reflective layer comprises semiconducting particles in electrical contact with said clusters forming the light absorbing layer and the conductive layer.

14. The working electrode according to claim 13, wherein the thickness of the reflective layer is between 0.1 µm and 10 µm.

15. The working electrode according to claim 13, wherein the reflective layer is porous, and the porosity of the reflective layer is between 40%-70%.

16. The working electrode according to claim 13, wherein the size of at least 80% of the semiconducting particles in the reflective layer is larger than 0.2 µm.

17. The working electrode according to claim 16, wherein the size of at least 80% of the semiconducting particles in the reflective layer is larger than 0.1 µm.

* * * * *